United States Patent
Nagai et al.

(10) Patent No.: US 8,021,821 B2
(45) Date of Patent: Sep. 20, 2011

(54) PHOTOSENSITIVE CONDUCTIVE PASTE FOR TRANSFERRING AND PHOTOSENSITIVE TRANSFER SHEET

(75) Inventors: Atsushi Nagai, Nagoya (JP); Kazutaka Nakayama, Nagoya (JP)

(73) Assignee: Noritake Co., Limited, Nagoya-Shi (JP)

( * ) Notice: Subject to any disclaimer, the term of this patent is extended or adjusted under 35 U.S.C. 154(b) by 61 days.

(21) Appl. No.: 12/320,410

(22) Filed: Jan. 26, 2009

(65) Prior Publication Data

US 2009/0197203 A1 Aug. 6, 2009

(30) Foreign Application Priority Data

Feb. 1, 2008 (JP) .................. 2008-023379

(51) Int. Cl.
- G03F 7/00 (2006.01)
- G03F 7/004 (2006.01)
- G03F 7/028 (2006.01)

(52) U.S. Cl. .................. 430/270.1; 430/322; 430/913; 430/950

(58) Field of Classification Search .............. 430/270.1, 430/322, 913, 950
See application file for complete search history.

(56) References Cited

U.S. PATENT DOCUMENTS

| | | | |
|---|---|---|---|
| 3,638,567 A * | 2/1972 | Walkup et al. ............. | 101/170 |
| 3,953,562 A * | 4/1976 | Hait et al. ............. | 264/83 |
| 6,156,237 A * | 12/2000 | Kubota et al. ............. | 252/512 |
| 6,184,621 B1 * | 2/2001 | Horiuchi et al. ............. | 313/586 |
| 6,214,527 B1 * | 4/2001 | Kosaka et al. ............. | 430/319 |
| 6,630,287 B2 * | 10/2003 | Towata ............. | 430/311 |
| 6,632,524 B1 * | 10/2003 | Toshima et al. ............. | 428/357 |
| 6,808,654 B2 * | 10/2004 | Hayashi et al. ............. | 252/512 |
| 6,890,997 B2 * | 5/2005 | Daly et al. ............. | 525/438 |
| 7,026,079 B2 * | 4/2006 | Louwet et al. ............. | 430/14 |
| 7,141,355 B2 * | 11/2006 | Iwanaga et al. ............. | 430/287.1 |
| 7,442,488 B2 * | 10/2008 | Lee et al. ............. | 430/270.1 |
| 7,582,404 B2 * | 9/2009 | Lee et al. ............. | 430/270.1 |
| 2001/0033219 A1 * | 10/2001 | Iha et al. ............. | 336/90 |
| 2003/0224688 A1 * | 12/2003 | Sugimoto et al. ............. | 445/24 |
| 2004/0166760 A1 * | 8/2004 | Kikuchi et al. ............. | 445/24 |
| 2008/0061694 A1 * | 3/2008 | Kim ............. | 313/582 |
| 2009/0004597 A1 * | 1/2009 | Ueoka et al. ............. | 430/270.1 |

FOREIGN PATENT DOCUMENTS

| JP | 06251621 A | * | 9/1994 |
|---|---|---|---|
| JP | A-2001-264965 | | 9/2001 |

OTHER PUBLICATIONS

Terrazas et al., "A New Genereation of Fluorosurfactants", Specialty Chemicals Magazine, vol. 24, No. 3, p. 19-22 (Mar. 2004).*

* cited by examiner

*Primary Examiner* — Amanda C. Walke

(74) *Attorney, Agent, or Firm* — Oliff & Berridge, PLC

(57) ABSTRACT

A photosensitive conductive paste for transferring including a metal powder, an inorganic material powder, a photosensitive resin and a polymerization initiator, and to be applied onto a surface of a transfer support, comprising an acrylic resin or a rosin-based resin.

15 Claims, 7 Drawing Sheets

FIG.8

(TABLE 1)

| | T1 | T2 | T3 | T4 | T5 | T6 | T7 | T8 |
|---|---|---|---|---|---|---|---|---|
| Ni POWDER | 50wt% (0.2μm) | ↓ | ↓ | ↓ | ↓ | ↓ | ↓ | 50 (0.3μm) |
| BaTiO₃ | 5wt% (0.05μm) | ↓ | ↓ | ↓ | ↓ | ↓ | 2.5 (0.05μm) | 2.0 (0.1μm) |
| DISPERSANT | 2.0wt% | ↓ | ↓ | ↓ | ↓ | ↓ | 2.5 | 2.0 |
| PHOTOSENSITIVE RESIN | 1.0wt% | 2.0 | 1.0 | 2.0 | 4.0 | 0.85 | 1.5 | 1.0 |
| POLYMERIZATION INITIATOR | 1.5wt% | 3.0 | 1.5 | 3.0 | 6.0 | 3.0 | 3.0 | 1.5 |
| ORGANIC ACID | 0.05wt% | 0.1 | 0.05 | 0.1 | 0.2 | 0.1 | 0.1 | 0.05 |
| SOLVENT | 45.45wt% | 37.9 | 39.7 | 37.15 | 31.3 | 37.15 | 31.77 | 39.7 |
| ACRYLIC RESIN | — | — | 0.75 | 0.75 | 1.5 | 1.9 | 1.13 | 0.75 |
| EXPOSING | △ | ○ | ○ | ○ | ○ | ○ | ○ | ○ |
| DEVELOPING (RESIDUE) | × | △ | ◎ | ◎ | ◎ | ○ | ◎ | ◎ |

FIG.9

(TABLE 2)

|  | T9 | T10 | T11 |
|---|---|---|---|
| Ni POWDER | 50wt% (0.3μm) | ← | ← |
| BaTiO$_3$ | 5wt% (0.05μm) | ← | ← |
| DISPERSANT | 2.0wt% | ← | ← |
| PHOTOSENSITIVE RESIN | 1.0wt% | 2.0 | 4.0 |
| POLYMERIZATION INITIATOR | 1.5wt% | 3.0 | 6.0 |
| ORGANIC ACID | 0.05wt% | 0.1 | 0.2 |
| SOLVENT | 39.7wt% | 37.15 | 31.3 |
| ROSIN-BASED RESIN | 0.75wt% | 0.75 | 1.5 |
| EXPOSING | ○ | ○ | ○ |
| DEVELOPING (RESIDUE) | ◎ | ◎ | ◎ |

FIG.10

(TABLE3.1)

| | H1 | H2 | H3 | T1 | T2 | T3 | T4 | T5 | T6 | T7 |
|---|---|---|---|---|---|---|---|---|---|---|
| PET FILM | FLUORINE-BASED | ↓ | ↓ | Si-BASED | ↓ | ↓ | ↓ | ↓ | ↓ | ↓ |
| Ni POWDER | 50wt% (0.2μm) | ↓ | ↓ | ↓ | ↓ | ↓ | ↓ | ↓ | ↓ | ↓ |
| BaTiO₃ | 10wt% (0.1μm) | ↓ | ↓ | ↓ | ↓ | ↓ | ↓ | ↓ | ↓ | ↓ |
| DISPERSANT | 2.0wt% | ↓ | ↓ | ↓ | ↓ | ↓ | ↓ | ↓ | ↓ | ↓ |
| PHOTOSENSITIVE RESIN | 2.0wt% | ↓ | ↓ | ↓ | ↓ | ↓ | ↓ | ↓ | ↓ | ↓ |
| POLYMERIZATION INITIATOR | 3.0wt% | ↓ | ↓ | ↓ | ↓ | ↓ | ↓ | ↓ | ↓ | ↓ |
| ORGANIC ACID | 0.1wt% | ↓ | ↓ | ↓ | ↓ | ↓ | ↓ | ↓ | ↓ | ↓ |
| SOLVENT | 39.7wt% | 29.4 | 25.9 | 39.7 | 29.4 | | | 25.9 | | |
| FLUORINE-BASED DISPERSANT | A:0.5wt% | A:3.5 | A:7.0 | A:0.5 | A:3.5 | B:3.5 | C:3.5 | A:7.0 | B:7.0 | C:7.0 |
| EXPOSING | ◎ | ○ | ○ | ○ | ○ | ○ | ○ | ○ | ○ | ○ |
| DEVELOPING (RESIDUE) | ◎ | ◎ | ◎ | △ | △ | △ | ○△ | ○△ | ○△ | ○ |
| REMOVAL | × | × | × | ◎ | ◎ | ◎ | ◎ | ◎ | ◎ | ◎ |

FIG.11

(TABLE3.2)

| | T8 | T9 | T10 | T11 | T12 | T13 | T14 | T15 | T16 |
|---|---|---|---|---|---|---|---|---|---|
| PET FILM | Si-BASED | ↓ | ↓ | ↓ | ↓ | ↓ | ↓ | ↓ | ↓ |
| Ni POWDER | 50wt% (0.2μm) | ↓ | 50 (0.3μm) | ↓ | 50 (0.2μm) | ↓ | ↓ | ↓ | ↓ |
| BaTiO₃ | 10wt% (0.1μm) | ↓ | 5 (0.1μm) | ↓ | 5 (0.5μm) | ↓ | ↓ | ↓ | ↓ |
| DISPERSANT | 2.0wt% | ↓ | ↓ | ↓ | ↓ | ↓ | ↓ | ↓ | ↓ |
| PHOTOSENSITIVE RESIN | 2.0wt% | 1.0 | 2.0 | ↓ | ↓ | ↓ | 1.0 | 2.0 | ↓ |
| POLYMERIZATION INITIATOR | 3.0wt% | 1.5 | 3.0 | ↓ | ↓ | ↓ | 1.5 | 3.0 | ↓ |
| ORGANIC ACID | 0.1wt% | ↓ | ↓ | ↓ | ↓ | ↓ | ↓ | ↓ | ↓ |
| SOLVENT | 22.9wt% | ↓ | 30.9 | 22.9 | ↓ | 22.9 | ↓ | 30.9 | 22.9 |
| FLUORINE-BASED DISPERSANT | C:10.0wt% | C:7.0 | ↓ | C:10.0 | C:7.0 | C:7.0 C10.0 | C:7.0 | ↓ | C:10.0 |
| EXPOSING | ○ | ○ | ○ | ○ | ○ | ○ | ○ | ○ | ○ |
| DEVELOPING (RESIDUE) | ○ | ○ | ○ | ○ | ○ | ○ | ○ | ○ | ○ |
| REMOVAL | ◎ | ◎ | ◎ | ◎ | ◎ | ◎ | ◎ | ◎ | ◎ |

PHOTOSENSITIVE CONDUCTIVE PASTE FOR TRANSFERRING AND PHOTOSENSITIVE TRANSFER SHEET

This application is based on Japanese Patent Application No. 2008-023379 filed Feb. 1, 2008, the contents of which are incorporated hereinto by reference.

BACKGROUND OF THE INVENTION

1. Field of the Invention

The present invention relates to a photosensitive conductive paste for transferring that is applied onto a surface of a transfer support of a photosensitive transfer sheet to be used for forming a conductive layer in a predetermined pattern, and a photosensitive transfer sheet formed by using the same.

2. Description of Related Art

It is known a photosensitive conductive paste for transferring applied onto a surface of a transfer support, the paste including metal powder, inorganic material powder and photosensitive resin, for instance, disclosed in JP 2001-264965. That kind of the photosensitive conductive paste for transferring is used for forming, for instance, a conductive layer of a laminated chip element such as a chip type laminated ceramic capacitor and laminated inductor. It is manufactured by applying the paste onto a surface of the transfer support and drying, exposing and developing it to have a predetermined pattern, and transferring it on a ceramic sheet, and by repeating the steps to form the laminated layers and burning.

It is a disadvantage that the aforementioned photosensitive conductive paste for transferring that includes photosensitive resin for photosensitivity, has more resin than the conductive paste for printing that is burnt after printing has, and accordingly, it is difficult to obtain the required electric capacitance due to reduction in the density of the conductive layer after dried or burnt. However, reduction in the content of the amount of the photosensitive resin for the required density of the conductive layer, causes difficulty in exposing and developing and deficiency in precision of the pattern due to generation of the residue and lack of a sharp pattern. Especially, reduction in the thickness of the applied photosensitive conductive paste for transferring causes more remarkable disadvantage as described above, in order to reduce effects of permeation of the photosensitive conductive paste that increase with the thinner dielectric layer for small-sizing, that is, thinning of the laminated chip element such as the laminated ceramic capacitor and laminated inductor.

It is therefore an object of the present invention to provide a photosensitive conductive paste for transferring to achieve efficiency in exposing and developing and the density of the conductive layer after dried or burnt, and a photosensitive transfer sheet formed by using the same.

The inventors found that efficiency in exposing and developing and the density of the conductive layer after dried or burnt were both achieved by adding any of acrylic resin, rosin-based resin and fluorine-based dispersant into the photosensitive conductive paste for transferring. That is, it was found that acrylic resin, rosin-based resin and fluorine-based dispersant function as a photosensitive resin reduction agent for achieving efficiency in exposing and developing even if the content of the photosensitive resin was reduced.

SUMMARY OF THE INVENTION

The object indicated above may be achieved according to a first mode of the invention, which provides a photosensitive conductive paste for transferring including a metal powder, an inorganic material powder, a photosensitive resin and a polymerization initiator, and to be applied onto a surface of a transfer support, including an acrylic resin or a rosin-based resin.

The object indicated above may be achieved according to a second mode of the invention, which provides a photosensitive conductive paste for transferring including a metal powder, an inorganic material powder, a photosensitive resin and a polymerization initiator, and to be applied onto a surface of a transfer support, including a fluorine-based dispersant.

The object indicated above may be achieved according to a third mode of the invention, which provides the paste of the first mode of the invention, wherein the photosensitive resin, the acrylic resin or rosin-based resin, and polymerization initiator are included in a ratio of 1:0.1-1.0:1.0-2.0.

The object indicated above may be achieved according to a fourth mode of the invention, which provides the paste of any one of the first to third mode of the invention, wherein the metal powder is a nickel (Ni) powder.

The object indicated above may be achieved according to a fifth mode of the invention, which provides the paste of any one of the first to fourth mode of the invention, wherein the inorganic material powder is a barium titanate.

The object indicated above may be achieved according to a sixth mode of the invention, which provides the paste of the fourth or fifth mode of the invention, wherein the nickel powder has 0.1-0.4 μm in average diameter and the barium titanate has 0.01-0.1 μm in average diameter.

The object indicated above may be achieved according to a seventh mode of the invention, which provides a photosensitive transfer sheet, wherein the photosensitive conductive paste for transferring according to any one of the first to sixth mode of the invention is applied onto a surface of the transfer support.

Since the first mode of the invention provides a photosensitive conductive paste for transferring including a metal powder, an inorganic material powder, a photosensitive resin and a polymerization initiator, and to be applied onto a surface of a transfer support, including an acrylic resin or a rosin-based resin, efficiency in exposing and developing is achieved and the density of the conductive layer after dried or burnt increases even if the content of the photosensitive resin is reduced, it can be provided with the photosensitive conductive paste that is sufficient both in the exposing and developing capability and the high density of the conductive layer after dried or burnt.

Since the second mode of the invention provides a photosensitive conductive paste for transferring including a metal powder, an inorganic material powder, a photosensitive resin and a polymerization initiator, and to be applied onto a surface of a transfer support, including a fluorine-based dispersant, efficiency in exposing and developing is achieved and the density of the conductive layer after dried or burnt increases even if the content of the photosensitive resin is reduced, it can be provided with the photosensitive conductive paste that is sufficient both in the exposing and developing capability and the density of the conductive layer after dried or burnt.

Since the third mode of the invention provides the paste wherein the photosensitive resin, the acrylic resin or rosin-based resin, and polymerization initiator are included in a ratio (in weight) of 1:0.1-1.0:1.0-2.0, it can be provided with the photosensitive conductive paste that is sufficient both in the exposing and developing capability and the density of the conductive layer after dried or burnt. When the ratio of the acrylic resin or rosin-based resin is below 0.1, the photosensitive resin reduction effect is insufficient, and when the ratio is over 1.0, the exposing and developing capability is not sufficient due to deficiency in the amount of the photosensitive resin or polymerization initiator.

Since the fourth mode of the invention provides the paste wherein the metal powder is a nickel (Ni) powder, it can be provided with the conductive layer in electric conductivity and durability after burnt.

Since the fifth mode of the invention provides the paste wherein the inorganic material powder is a barium titanate, contraction of the conductive layer after dried or burnt is restrained to prevent generation of such as cracks, and the bonding strength is increased if the ceramic sheet to which it is transferred is made of barium titanate for the laminated chip capacitor.

Since the sixth mode of the invention provides the paste wherein the nickel (Ni) powder has 0.1-4.4 μm in average diameter and the barium titanate has 0.01-0.1 μm in average diameter, it can be provided with the conductive layer that is dense and rigidly bonded in itself after transferred onto the ceramic sheet and burnt Reduction in the average diameter of the metal powder of such as the nickel (Ni) smaller than 0.1 μm causes increasing in viscosity (thixotropy) of the photosensitive conductive paste for transferring, and the nickel larger than 0.4 μm causes reduction in permeation of light, and accordingly, reduction in permeability upon exposing and precision of the pattern. The inorganic material powder such as barium titanate having less than 0.01 μm in average diameter causes reduction in permeation of light upon exposing and insufficiency in the contraction restraining effect, and more than 0.1 μm causes reduction in the density of the membrane (layer) or in transmission between the metal powders.

Since the seventh mode of the invention provides a photosensitive transfer sheet wherein the photosensitive conductive paste for transferring according to any one of the first to sixth mode of the invention is applied onto a surface of the transfer support, it can be provided with the sheet that is sufficient both in the exposing and developing capability and the high density of the conductive layer after dried or burnt.

Hereinafter, there will be described the best modes for the present invention.

The aforementioned metal powder may be any of not only nickel but such as silver, gold, copper and aluminum, or metal conductive powder such as a mixture of a plurality of metal powders.

The aforementioned inorganic material powder may be any ceramic powder of not only barium titanate but such as alumina, zirconia, silicon oxide, borosilicate-based glass and crystallized glass. That is, it may be any that functions as material prepared for preventing such as cracking and stripping or a filler and moderates the contraction of the photosensitive conductive paste for transferring upon drying or burning.

The aforementioned transfer support may be a flexible or rigid synthetic resin sheet such as a PET (polyethylene terephthalate) film of which the photosensitive conductive paste for transferring is strippable or removable after dried, or a paper coated with a stripping agent such as silicon resin or fat. Preferably, a translucent sheet through which a light such as an ultraviolet light for exposing is easily transmittable is used such that exposing from the opposite side of the applied surface of the photosensitive conductive paste for transferring is possible. The translucent sheet may be made of such as polyethylene terephthalate, polyethylene naphthalate, polyphenylene sulfide, polystylene, polypropylene, polyethylene, polysulfone, polyamide, polycarbonate, polyvinyl alcohol, polyimide, cellophane, a cellylose derivative such as triacetyl cellulose or ionomer.

The photosensitive resin may be a substance that is a polymer constituting a skeleton of resin by a reaction, for instance, is constituted of an alkali developing type binder polymer and/or monomer, and disappears upon burnt. It may be a mixture of the aforementioned alkali developing type binder polymer and a non-alkali developing type binder polymer such as polyvinyl alcohol, polyvinyl butyral, acrylic ester polymer, methacrylate ester polymer, polystylene, α-methyl styrene polymer or 1-vinyl-2-pyrrolidone polymer.

The aforementioned reactive binder polymer may be, for instance, a copolymer constituted of at least one acid anhydride such as acrylic acid, methacrylic acid, a dimer of acrylic acid, itaconic acid, crotonic acid, maleic acid, fumaric acid, vinyl acetate, and at least one selected from the group of methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, sec-butyl acrylate, sec-butyl methacrylate, isobutyl acrylate, isobutyl methacrylate, tert-butyl acrylate, tert-butyl-methacrylate, n-pentyl acrylate, n-pentyl methacrylate, n-hexyl acrylate, n-hexyl methacrylate, 2-ethyl hexyl acrylate, 2-ethyl hexyl methacrylate, n-octyl acrylate, n-octyl methacrylate, n-decyl acrylate, n-decyl methacrylate, styrene, α-methyl styrene, 1-vinyl-2-pyrrolidone.

The aforementioned reactive monomer may be any of an organic compound having at least one polymerizable carbon-carbon unsaturated bond such as allyl acrylate, benzyl acrylate, butoxy ethyl acrylate, butoxy ethylene glycol acrylate, cyclohexyl acrylate, dicyclopentanyl acrylate, 2-ethyl hexyl glycol acrylate, glycerol acrylate, glycidyl acrylate, 2-hydroxyethyl acrylate, isobonyl acrylate, lauryl acrylate, 2-methoxyethyl acrylate, ethoxyethylene glycol acrylate, enoxyethyl acrylate, stearyl acrylate, ethylene glycol diacrylate, diethylene glycol diacrylate, 1,4-butanediol diacrylate, 1,5-butanediol diacrylate, 1,6-hexanediol diacrylate, 1,3-propanediol acrylate, 1,4-cyclohexanediol diacrylate, 2,2-dimethylol propane diacrylate, glycerol diacrylate, tripropylene glycol diacrylate, glycerol triacrylate, trimethylolpropane triacrylate, trimethylolpropane triacrylate, polyoxyethylic trimethylolpropane triacrylate, pentaerythritol tetraacrylate, pentaerythritol tetraacrylate, triethylene glycol diacrylate, polyoxypropyl trimethylolpropane triacrylate, butylene glycol diacrylate, 1, 2,4-butanetriol triacrylate, 2,2,4-trimethyl-1,3-pentanediol diacrylate, diallyl fumarate, 1,10-decanediol dimethyl acrylate, pentaerythritol hexaacrylate, any one of the aforementioned acrylates in which acrylate is replaced by methacrylate, γ-methacryloxypropyl trimethoxysilan, 1-vinyl-2-pyrrolidone, or a mixture of a plurality of the aforementioned substances.

The aforementioned polymerization initiator, finally being a component of the photosensitive resin in the photosensitive conductive paste for transferring, is a substance for principally initiating polymerization by generating an optical radical (a free radical being the initial end of the chain carrier (growing chain) of the radical polymerization) by absorption of a light such as an ultraviolet light. It may be such as benzophenone, methyl o-benzoylbenzoate, 4,4-bis(dimethylamine) benzophenone, 4,4-bis(diethylamine) benzophenone, α-amino acetophenone, 4,4-dichloro benzophenone, 4-benzoyl-4-methyl diphenyl ketone, dibenzyl ketone, fluorene, 2,2-dimethoxy-2-phenyl acetophenone, 2,2-hydroxy-2-methyl propiophenone, p-tetr-butyl dichloro acetophenone, thioxantone, 2-methyl thioxantone, 2-chloro thioxantone, 2-isopropyl thioxantone, diethyl thioxantone, benzyl metoxyethyl acetal, benzoin methylether, anthraquinone, tetr-butylanthraquinone, 2-amylanthraquinone, β-chloranthraquinone, anthrone, benzanthrone, dibenzanthrone, methylene anthrone, 4-azide benzyl acetophenone, 2,6-bis(p-azide benzylidene)cyclohexane, 2,6-bis(azide benzylidene)-4-methylcyclohexane, 2-phenyl-1,2-butanedion-2-(o-ethoxycarbonyl) oxime, 1-phenyl-propanedion-2-(o-thoxycarbonyl) oxime, 1,3-ethoxy-propanetrion-2-(o-benzoyl) oxime, Michler's ketone, 2-methyl-[4-(methylthio) phenyl]-2-morpholino-1-propane, naphthalene sulfonylchloride, quinoline sulfonylchloride, n-phenylthio acrydone, 4,4-azobisisobutyronitrile, diphenyl disulfide, benzthiazolsulfide, triphenylphosphine, camphor quinone, carbon tetrabromide, tribromophenyl sulfone, benzoin peroxide, or a combination of a photoreductive pigment such as eosin or methylene blue and a reducer such as ascorbic acid or triethanolamine.

The aforementioned photosensitive resin component (photosensitive resin and polymerization initiator) and the photosensitive conductive paste for transferring including it may include such as a conventional antigelling agent, sensitizer such as an ultraviolet light absorber, preservation stabilizing agent (antigelling agent) such as a polymerization terminator, chain transfer agent, levelling agent, antioxidant, plasticizer, surfactant, antifoam agent, polycarboxylic or carboxylic paste dispersion improver, if necessary.

The aforementioned acrylic resin for the photosensitive resin (vehicle) may be a polymethacrylate ester having the molecular weight of 150000-300000 at the temperature of −20° C. to 100° C. such as an itaconic acid, crotonic acid, maleic acid or vinyl acid. For adding to the paste, for instance, such as a polymethacrylate ester having the molecular weight of 150000-300000 at the temperature of −20° C. to 100° C. and polymerizing in an organic solvent is preferably used with the organic solvent such as terpineol or dihydro terpineol.

For the aforementioned rosin-based resin, natural rosin and synthetic rosin such as rosin ester, hydro rosin, polymer rosin, polymer rosin ester and rosin amine are preferably used.

For the aforementioned fluorine-based dispersant, nonion oligomer having the molecular weight of 10000-100000, being classified into three sorts of it by the monomer ratios as 30% or less, 30%-60% and 60% or more, that is, the small, middle or large value, respectively, is preferably used. Other dispersants such as a polycarboxylic or carboxylic dispersant may be used for improving paste dispersibility of the photosensitive conductive paste for transferring.

For such as viscosity control of the aforementioned photosensitive conductive paste for transferring, the conventional solvents such as alcohols, terpenes or aromatic hydrocarbons, or the solvent for vehicle such as terpineol, dihydro terpineol, tridecanol, decanol, benzyl alcohol, 2 ethyl hexanol, alcohol ester ethylene glycol, diethylene glycol monobutyl acetate may be used.

BRIEF DESCRIPTION OF THE DRAWINGS

FIG. 8 illustrates Table 1 showing the contents of a plurality of samples and evaluated results to prove the effects by the photosensitive conductive paste including acrylic resin.

FIG. 9 illustrates Table 2 showing the contents of a plurality of samples and evaluated results to prove the effects by the photosensitive conductive paste including rosin-based resin.

FIG. 10 illustrates Table 3.1 partly showing the contents of a plurality of samples and evaluated results to prove the effects by the photosensitive conductive paste including the fluorine-based dispersant.

FIG. 11 illustrates Table 3.2 partly showing the contents of a plurality of samples and evaluated results to prove the effects by the photosensitive conductive paste including the fluorine-based dispersant.

DETAILED DESCRIPTION OF EXEMPLARY EMBODIMENTS

Hereinafter, there will be described the present invention by reference to the drawings. The figures are appropriately simplified or transformed, and all the proportion of the dimension and the shape of a portion or member may not be reflective of the real one in the following embodiments.

Figure 1:
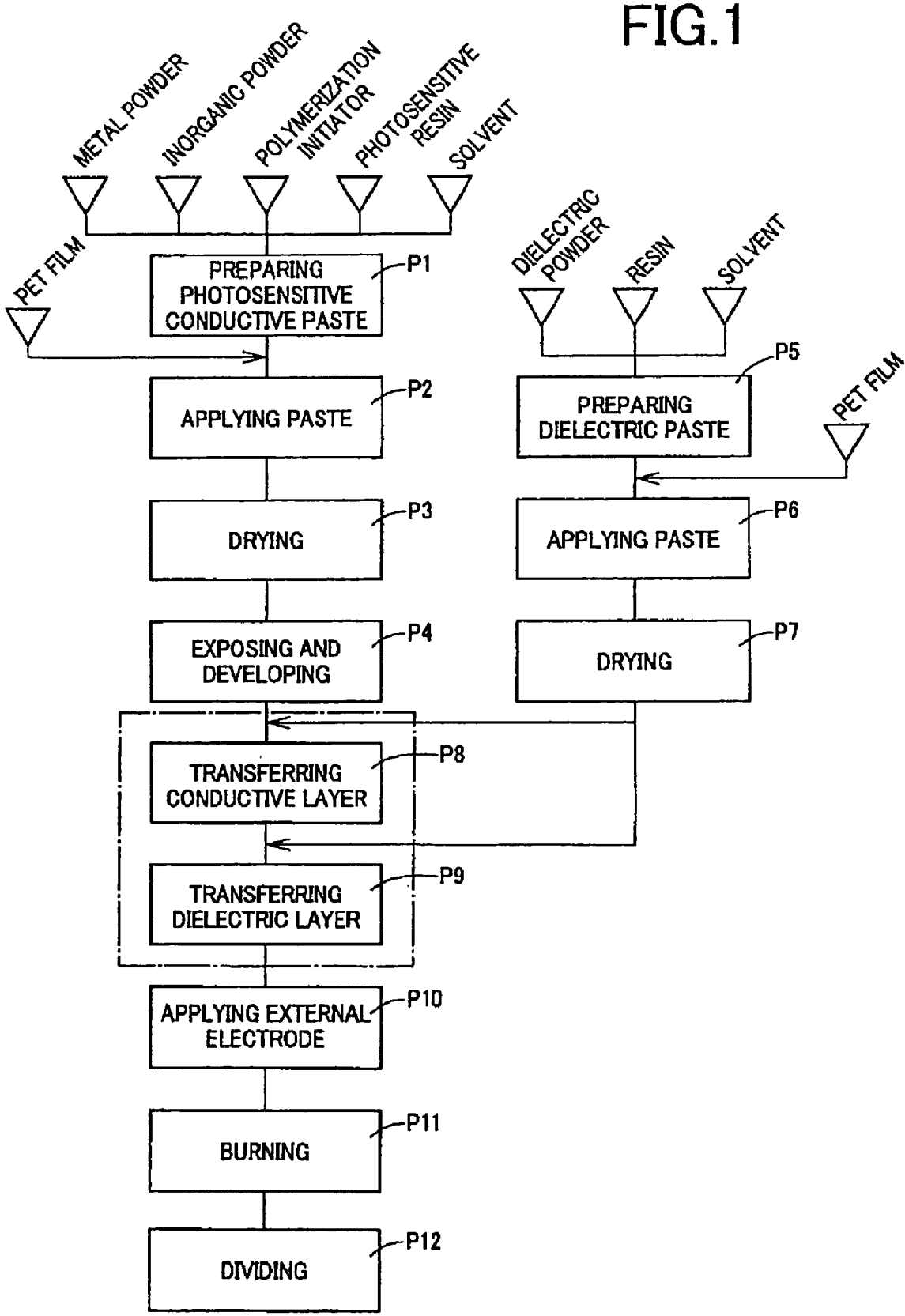
FIG. 1 illustrates essentials of steps for manufacturing the laminated chip capacitor using the photosensitive conductive transfer sheet according to an embodiment of the present invention.
Figure 2:
FIG. 2 illustrates the transfer support with the photosensitive conductive paste applied onto and fixed in the conductive paste applying step and the drying step in FIG. 1.
Figure 6:
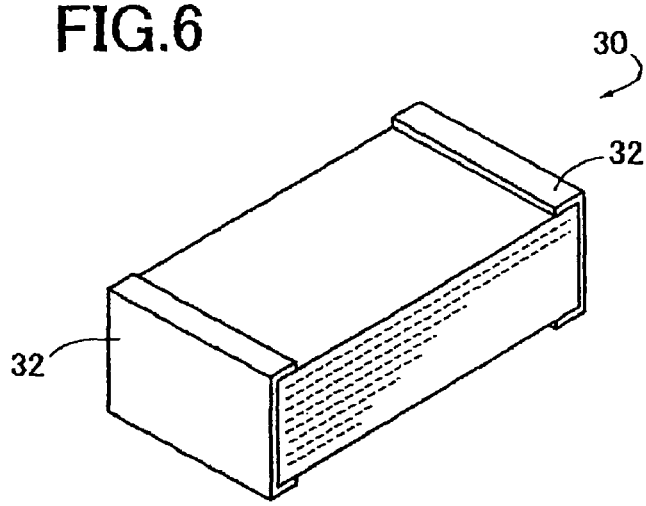
FIG. 6 illustrates an example of the laminated chip capacitor manufactured in the steps in FIG. 1 in a perspective view.

FIG. 1 shows steps for manufacturing a laminated chip capacitor 30 using a photosensitive conductive transfer sheet 10, for instance, as shown in FIG. 6. In FIG. 1 a photosensitive conductive paste 12 having a predetermined viscosity is controlled and prepared by weighing a predetermined amount for a proper ratio of acrylic resin, rosin-based resin or fluorine dispersant, mixing it with such as metal powder, inorganic material powder, photosensitive resin and polymerization initiator, and a proper amount of a solvent, and kneading the mixture in such as a kneader having three rollers in the conductive paste preparing step P1. In the conductive paste applying step P2, a surface of the transfer support 14 made of, for instance, a PET film is coated with the aforementioned photosensitive conductive paste 12 such that the paste extends as a layer with a predetermined thickness such as in a blade coating process using a doctor blade or roll coating process using a coating roller. In the drying step P3, the photosensitive conductive paste 12 applied on the transfer support 14 is dried to be layeredly fixed as shown in FIG. 2.

Figure 3:
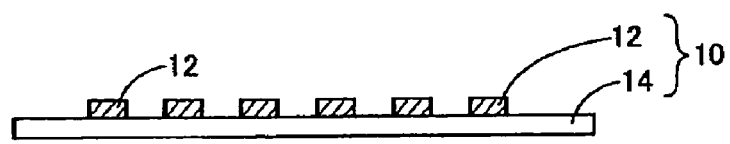
FIG. 3 illustrates the transfer support with the photosensitive conductive paste after developed in a predetermined pattern in the exposing and developing step in FIG. 1.

In the exposing and developing step P4, a predetermined pattern mask is disposed on a surface or both surfaces of the transfer support 14 of which a surface is coated with the aforementioned photosensitive conductive paste 12, the surface or both surfaces of the transfer support 14 is/are exposed to ultraviolet light from such as a xenon lamp, then, the surface of the transfer support 14 is washed with a alkali solution such as a sodium carbonate ($Na_2CO_3$) solution to remove the photosensitive conductive paste 12 on a non-exposed part, to be developed. Thus, the photosensitive conductive transfer sheet 10 having the predetermined pattern of the photosensitive conductive paste 12 fixed on the transfer support 14 is manufactured, as shown in FIG. 3.

In the dielectric paste preparing step P5, a dielectric paste 16 having a predetermined viscosity is prepared by weighing a predetermined amount for a proper ratio of such as dielectric powder having high dielectric constant such as barium titanate and resin, and kneading them with a proper amount of a solvent. In the dielectric paste applying step P6, a surface of the transfer support 18 made of, for instance, a PET film is coated with the aforementioned dielectric paste 16 such that the paste extends as a layer with a predetermined thickness such as in a blade coating process using a doctor blade or roll coating process using a coating roller. In the drying step P7, the dielectric paste 16 applied on the transfer support 18 is dried to be layeredly fixed and to manufacture a dielectric transfer sheet 20 as shown in the bottom part of FIG. 4.

Figure 4:
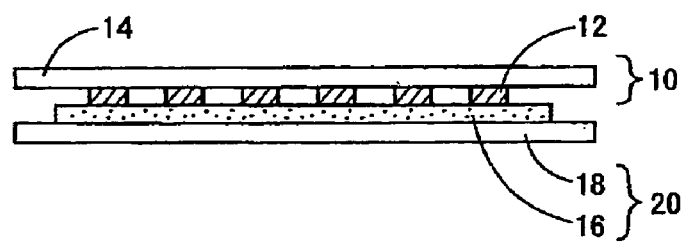
FIG. 4 illustrates the transfer support with the dielectric layer on and the conductive layer in a predetermined pattern formed on the dielectric layer in the conductive layer transfer step in FIG. 1.
Figure 5:
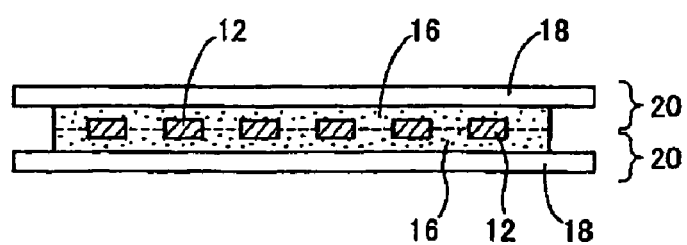
FIG. 5 illustrates the transfer support with the dielectric layer on and another dielectric layer formed on the former dielectric layer with the interposed conductive layer in a predetermined pattern in the dielectric layer transfer step in FIG. 1.

In the conductive layer transfer step P8, as shown in FIG. 4, the photosensitive conductive transfer sheet 10 is pressed on the dielectric paste 16 that is layeredly fixed onto the transfer support 18 of the dielectric transfer sheet 20 after a predetermined positioning operation, and the photosensitive conductive paste 12 fixed onto the transfer support 14 is pressed on the dielectric paste 16 at a predetermined pressure and is heated if necessary. Then, transferring the conductive layer is completed by removing the transfer support 14. In the dielectric layer transfer step P9, as shown in FIG. 5, another dielectric transfer sheet 20 is pressed on the aforementioned dielectric paste 16 with the aforementioned photosensitive conductive paste 12 transferred on it after a predetermined positioning operation, and the dielectric paste 16 fixed onto the transfer support 18 of the another dielectric transfer sheet 20 is pressed on the aforementioned dielectric paste 16 interposing the photosensitive conductive paste 12 already transferred at a predetermined pressure, and is heated if necessary. Then, transferring the dielectric layer is completed by removing the transfer support 18. The desired laminated chip capacitor 30 having the required layers is manufactured by laminating after the aforementioned conductive layer transfer step P8 and the dielectric layer transfer step P9 are repeated. A set of the aforementioned conductive layer transfer step P8 and the dielectric layer transfer step P9 also function as the laminating step.

In the external electrode applying step P10, a conductive paste is applied onto an end portion of the dielectric layer laminated by transferring in the conductive layer transfer step P8 and the dielectric layer transfer step P9, and is dried to form an external electrode of the aforementioned laminated chip capacitor 30. In the burning step P11, the laminated dielectric layers of which the end portion is coated with the conductive paste are burnt in a burning furnace, and in the dividing step P12, they are divided into the laminated chip capacitors 30 having the predetermined size as shown in FIG. 6.

Figure 7:
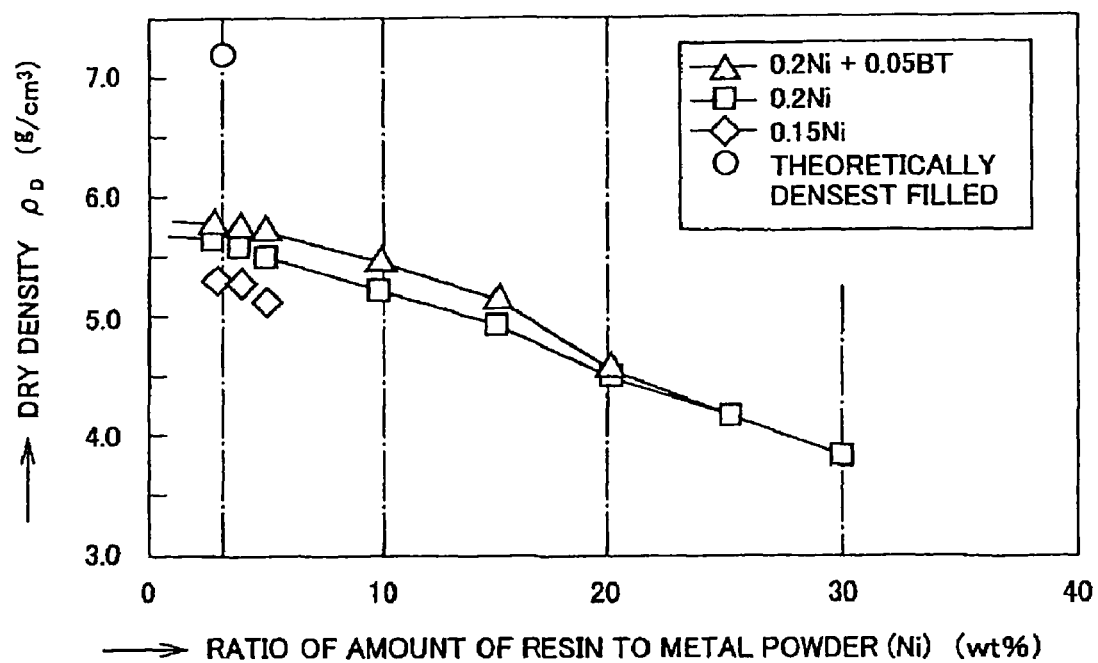
FIG. 7 is a graph indicating the relationship of the ratio (wt. %) of the amount of the resin to the metal powder and the dry density $\rho_D$ in the conductive paste.

FIG. 7 is a graph plotting the results measured by the inventors of the present invention. As shown in FIG. 7, the dry density $\rho_D$ (g/cm$^3$), in general, increases with reduction in the ratio (wt. %) of the amount of resin such as the photosensitive resin and the polymerization initiator to the metal powder such as nickel powder for the conductive paste. Since about 3 wt. % to the metal powder is sufficient for the conductive paste for printing that does not require exposing and developing, 5 g/cm$^3$ or more in the dry density $\rho_D$ is obtained and it can be obtained the sufficiently dense conductor after burnt even if, for instance, applied to be a thin layer. However, since 20 wt. % or less to the metal powder cannot be allowed for the photosensitive conductive paste 12 including the photosensitive conductive resin and polymerization initiator for exposing and developing in order to maintain the exposing and developing capability, the density of the conductive layer after dried or burnt becomes insufficient if thin coating is applied, and, accordingly, for instance, the sufficient capacitance in the laminated chip capacitor 30 cannot be obtained. Thin coating of the photosensitive conductive paste is required for the reason that it is provided the thin conductive layer after burnt and that the large amount of the resin to the metal powder may cause deterioration in insulation between the conductive layers due to impregnation after laminating because it is provided the thin dielectric layer of, for instance, about 1 μm after dried.

The inventors have studied for obtaining the proper paste content of the photosensitive conductive paste 12 for the sufficient exposing and developing capability, on the condition that it is necessary to provide the same amount of the resin (such as photosensitive resin, polymerization initiator and organic acid) to the metal powder as that of the conventional conductive paste for printing, and found that even the small amount of the resin permits to provide preferable exposing and developing capability if it includes acrylic resin, rosin-based resin or fluorine dispersant. There are described experiments by the inventors below with FIGS. 8-10.

Table 1 in FIG. 8 shows the samples and evaluated results for the effects by the photosensitive conductive paste 12 including acrylic resin (polymethacrylate ester). In the present experiment the paste samples T1-T8 with the respective contents shown in Table 1 were prepared. And in the steps P2-P4 in FIG. 1, the paste was applied on the fluorine-based PET film of the transfer support, dried, exposed with a predetermined test pattern on at 300-1200 mJ for the one surface and at 600-2400 mJ for the both surfaces, and developed with 0.2-2% $Na_2CO_3$ solution. The exposed and developed pattern was evaluated. The evaluation for the exposing and developing capability of the photosensitive conductive paste samples T1-T8, as to whether the residue (dirt of pattern) is present after developed, was conducted in this test, taking advantage of the occurrence of the residue in the non-exposed or non-developed portion.

As shown in Table 1 in FIG. 8, the residue occurred in the photosensitive conductive paste samples T1 and T2 including no acrylic resin, and it indicates that the exposing and developing capability was insufficient. On the other hand, no residue occurred in the photosensitive conductive paste samples T3 to T8 including acrylic resin, and it indicates that the exposing and developing capability was sufficient. Among Samples T3 to T8, Sample T5 is not sufficient in the dry density or burning density due to including the resin amount of 20.4 wt. % to the nickel powder. Samples T3, T4, T6 and T8 are sufficient both in the exposing and developing capability and the density of the conductive layer after dried or burnt. Samples T3, T4, T6 and T8 include 5.1-10.2 wt. % resin to the nickel powder and 0.75-1.9 wt. % acrylic resin to the photosensitive conductive paste sample. Among Samples T3, T4, T6 and T8 capable of sufficient exposing and developing, Sample T6 is in some degree inferior in the exposing and developing capability, possibly due to its content of 1.9 wt. % acrylic resin, somewhat more than the range of 0.75-1.13 wt. % acrylic resin of the other samples. Among Samples T3, T4, T7 and T8 capable of sufficient exposing and developing, Sample T8 uses inorganic material powder (BT: $BaTiO_3$) having about 0.1 μm in average diameter, about double the size of those of the other samples.

In Table 1, the ratio of the photosensitive resin, acrylic resin and polymerization initiator is 1:0.375-0.75:1.5.

Table 2 in FIG. 9 shows the samples and evaluated results for the effects by the photosensitive conductive paste 12 including rosin-based resin (rosin amine). In the present experiment the paste samples T9-T11 with the respective contents shown in Table 2 were prepared. And in the steps P2-P4 in FIG. 1, the paste was applied, dried, exposed with a predetermined test pattern, and developed. They were evaluated using the exposed and developed pattern. The evaluation for the exposing and developing capability of the photosensitive conductive paste samples T9-T11, as to whether the residue (dirt of pattern) is present after developed, was conducted in this test, as well as in the test in Table 1.

As shown in Table 2 in FIG. 9, no residue occurred in the photosensitive conductive paste samples T9 to T11 including the rosin-based resin, and it indicates that the exposing and developing capability was sufficient. Samples T9 to T11 include 5.1-20.4 wt. % resin to the nickel powder and 0.75-1.5 wt. % rosin-based resin to the photosensitive conductive paste sample. Among Samples T9 to T11 capable of sufficient exposing and developing, Sample T11 is not sufficient in the dry density due to including the resin amount of 20.4 wt. % to the nickel powder. Samples T9 and T10 are sufficient both in the exposing and developing capability and the density of the conductive layer after dried or burnt.

In Table 2, the ratio of the photosensitive resin, rosin-based resin and polymerization initiator is 1:0.375-0.75:1.5.

Table 3 constituted of Tables 3.1 and 3.2 in FIGS. 10 and 11 respectively shows the samples and evaluated results for the effects by the photosensitive conductive paste 12 including the fluorine-based dispersant (nonion oligomer). In the present experiment, as well as in the step P1 in FIG. 1, the paste samples H1-H3 (for comparison) and T1-T16 (for embodiments) with the respective contents shown in Tables 3.1 and 3.2 were prepared. The transfer support in Samples H1-H3 for comparison is constituted of the fluorine-based PET film on which the residue upon developing comparatively tends to flow, and the transfer support in Samples T1-T16 for embodiments is constituted of the silicon-based PET film on which the residue upon developing comparatively is difficult to flow. And in steps as well as in the steps P2-P4 in FIG. 1, the paste was applied onto the fluorine- or silicon-based PET film, dried, exposed with a predetermined test pattern on at 300-1200 mJ for the one surface and at 600-2400 mJ for the both surfaces, and developed with 0.2-2% $Na_2CO_3$ solution. They were evaluated using the exposed and developed pattern. The evaluation for the exposing and developing capability of the photosensitive conductive paste samples T1-T16, as to whether the residue (dirt of pattern) is present after developed, was conducted in this test. As shown in Table 3 in FIGS. 10 and 11, three kinds of fluorine-based dispersants in the monomer ratio, the grade A is 30% or less, the grade B is 30-60% and the grade C is 60% or more in the monomer ratio, are used in the test.

As shown in Table 3 in FIGS. 10 and 11, no residue occurred in Samples H1 to H3 for comparison in which the paste respectively includes 0.5 wt. %, 3.5 wt. % and 7.0 wt. % grade-A fluorine-based dispersant and is applied onto the fluorine-based PET film, and it indicates that the exposing and developing capability was insufficient, however, it provides an insufficient yield in transferring due to extreme inferiority in removal of the transfer support made of the fluorine-based PET film upon transferring. Samples T1 to T16 in which the paste 12 respectively includes grade-A, -B or -C fluorine-based dispersant in the range of 3.5-10.0 wt. % to the paste 12 and the paste is applied onto the silicon-based PET film, is inferior to some degree in developing to Samples H1 to H3, however, is superior in removal and includes 5.2-10.2 wt. % resin, and accordingly, is sufficient both in the exposing and developing capability and the density of the conductive layer after dried or burnt. The residue reduces with reduction in the ratio of the fluorine-based dispersant and the monomer ratio as appeared in Samples T2 to T4 and T5 to T8. Sample T9 has 2.6 wt. % resin, about a half of 5.1 wt. % of the total of the paste with respect to Samples T1 to T8, Sample T10 has 5.0 wt. % inorganic material powder (BT: $BaTiO_3$), about a half of 10.0 wt. % of the total of the paste with respect to Samples T1 to T8, Sample T11 has 5.0 wt. % inorganic material powder (BT: $BaTiO_3$), about a half of 10.0 wt. % of the total of the paste with respect to Samples T1 to T8 and 10.0 wt. % grade-C fluorine-based dispersant of the total of the paste, and they provided proper results as well as Samples T1 to T8 in the evaluation. Sample T12 has 2 μm in the average diameter of the nickel powder larger than 0.3 μm of Sample T10 and 0.5 μm in the average diameter of the inorganic material powder (BT: $BaTiO_3$) larger than 0.1 μm, Sample T13 has 10.0 wt. % grade-C fluorine-based dispersant larger than 7.0 wt. % of the total of the paste with respect to Sample T12, and they provided proper results as well as Samples T1 to T8 in the evaluation. Sample T14 has 2.6 wt. % resin, about a half of 5.1 wt. % of the total of the paste with respect to Sample T12, Sample T15 has 10.0 wt. % solvent larger than 7.0 wt. % of the total of the paste with respect to Sample T12, Sample T16 has 10.0 wt. % grade-C fluorine-based dispersant larger than 7.0 wt. % of the total of the paste with respect to Sample T15, and they provided proper results as well as Samples T1 to T8 in the evaluation.

In Table 3, the ratio of the photosensitive resin, fluorine-based dispersant and polymerization initiator is 1:0.25-7.0:1.5. The aforementioned average diameter was measured by the LA-920 laser diffraction scattering particle size distribution measurement instrument of Horiba Seisakusho K.K. in Japan.

As described above, since the photosensitive conductive paste 12 according to the present embodiment includes acrylic resin or rosin-based resin, and accordingly, efficiency in exposing and developing is achieved and the density of the conductive layer after dried or burnt increases even if the content of the photosensitive resin is reduced, it can be provided with the photosensitive conductive paste 12 that is sufficient both in the exposing and developing capability and the density of the conductive layer after dried or burnt.

Since the photosensitive conductive paste 12 according to the present embodiment includes the fluorine-based dispersant, and accordingly, efficiency in exposing and developing is achieved and the density of the conductive layer after dried or burnt increases even if the content of the photosensitive resin is reduced, it can be provided with the photosensitive conductive paste 12 that is sufficient both in the exposing and developing capability and the density of the conductive layer after dried or burnt.

Since the photosensitive conductive paste 12 according to the present embodiment includes the photosensitive resin, acrylic resin or rosin-based resin and polymerization initiator in a ratio of 1:0.1-1.0:1.0-2.0 (in weight), it can be provided with the photosensitive conductive paste 12 that is sufficient both in the exposing and developing capability and the density of the conductive layer after dried or burnt.

Since, in the photosensitive conductive paste 12 according to the present embodiment, the metal powder is nickel (Ni) powder, it can be provided with the conductive layer superior in electric conductivity and durability after burnt.

Since, in the photosensitive conductive paste 12 according to the present embodiment, the inorganic material powder is barium titanate, contraction of the conductive layer after dried or burnt is restrained to prevent generation of such as cracks, and the bonding strength is increased if the ceramic sheet to which it is transferred is made of barium titanate for the laminated chip capacitor.

Since, in the photosensitive conductive paste 12 according to the present embodiment, the nickel (Ni) powder has 0.1-0.4 µm in average diameter and the aforementioned barium titanate has 0.01-0.1 µm in average diameter, it can be provided with the conductive layer that is dense and rigidly bonded in itself after transferred onto the ceramic sheet and burnt. Reduction in the average diameter of the metal powder of such as the nickel (Ni) smaller than 0.1 µm causes increasing in viscosity (thixotropy) of the photosensitive conductive paste for transferring, and the nickel larger than 0.4 µm causes reduction in permeation of light, and accordingly, reduction in permeability upon exposing and precision of the pattern. The inorganic material powder such as barium titanate having less than 0.01 µm in average diameter causes reduction in permeation of light upon exposing and insufficiency in the contraction restraining effect, and more than 0.1 µm causes reduction in the density of the membrane (layer).

Since, in the photosensitive transfer sheet 10 according to the present embodiment, the photosensitive conductive paste 12 is applied onto a surface of the transfer support 14, it can be provided with the sheet 10 that is sufficient both in the exposing and developing capability and the density of the conductive layer after dried or burnt.

It is to be understood that the present invention may be embodied with other changes, improvements, and modifications that may occur to a person skilled in the art without departing from the scope and spirit of the invention defined in the appended claims.

What is claimed is:

1. A photosensitive conductive paste for transferring including a metal powder, an inorganic material powder, a photosensitive resin and a polymerization initiator, and to be applied onto a surface of a transfer support, comprising:
    a rosin-based resin.

2. A photosensitive conductive paste for transferring including a metal powder, an inorganic material powder, a photosensitive resin and a polymerization initiator, and to be applied onto a surface of a transfer support, comprising:
    a fluorine-based dispersant.

3. The paste of claim 1, wherein the photosensitive resin, the rosin-based resin, and the polymerization initiator are included in a ratio of 1:0.1-1.0:1.0-2.0.

4. The paste of claim 1, wherein the metal powder is a nickel powder.

5. The paste of claim 2, wherein the metal powder is a nickel powder.

6. The paste of claim 1, wherein the inorganic material powder is a barium titanate.

7. The paste of claim 2, wherein the inorganic material powder is a barium titanate.

8. The paste of claim 1, wherein the metal powder is a nickel powder having 0.1-0.4 µm in average diameter and the inorganic material powder is a barium titanate having 0.01-0.1 µm in average diameter.

9. The paste of claim 2, wherein the metal powder is a nickel powder having 0.1-0.4 µm in average diameter and the inorganic material powder is a barium titanate having 0.01-0.1 µm in average diameter.

10. A photosensitive transfer sheet, wherein the photosensitive conductive paste for transferring according to claim 1 is applied onto a surface of the transfer support.

11. A photosensitive transfer sheet, wherein the photosensitive conductive paste for transferring according to claim 2 is applied onto a surface of the transfer support.

12. The paste of claim 2, wherein the fluorine-based dispersant is a non ion oligomer having a molecular weight of 10,000-100,000.

13. The paste of claim 1, wherein a rate of the rosin-based resin to the metal powder ranges from 5.1 to 10.2%.

14. The paste of claim 2, wherein a rate of the fluorine-based dispersant to the metal powder ranges from 5.2 to 10.2%.

15. The paste of claim 2, wherein the photosensitive resin, the fluorine-based dispersant, and the polymerization initiator are included in a ratio of 1:0.25 to 7.0:1.5.

* * * * *